(12) United States Patent
Shimura

(10) Patent No.: US 7,251,084 B2
(45) Date of Patent: Jul. 31, 2007

(54) FRESNEL LENS AND AN ILLUMINATING DEVICE PROVIDED WITH THE FRESNEL LENS

(75) Inventor: Takashi Shimura, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 71 days.

(21) Appl. No.: 10/900,313

(22) Filed: Jul. 28, 2004

(65) Prior Publication Data
US 2005/0024746 A1 Feb. 3, 2005

(30) Foreign Application Priority Data
Jul. 29, 2003 (JP) ............... 2003-202748

(51) Int. Cl.
G02B 3/08 (2006.01)

(52) U.S. Cl. .................... 359/742; 359/743

(58) Field of Classification Search ........ 359/742, 359/743
See application file for complete search history.

(56) References Cited

U.S. PATENT DOCUMENTS
4,936,657 A * 6/1990 Tejima et al. ............ 349/7

FOREIGN PATENT DOCUMENTS
JP 62276502 A * 12/1987
JP 05164906 A * 6/1993

* cited by examiner

Primary Examiner—Scott J. Sugarman
(74) Attorney, Agent, or Firm—Dennison, Schultz & MacDonald

(57) ABSTRACT

A refractive Fresnel lens part is provided on an upper surface of a plate-like lens at a central portion. A reflective Fresnel lens part is provided on a lower surface of the plate-like lens at a peripheral portion.

12 Claims, 8 Drawing Sheets

FIG. 13
PRIOR ART
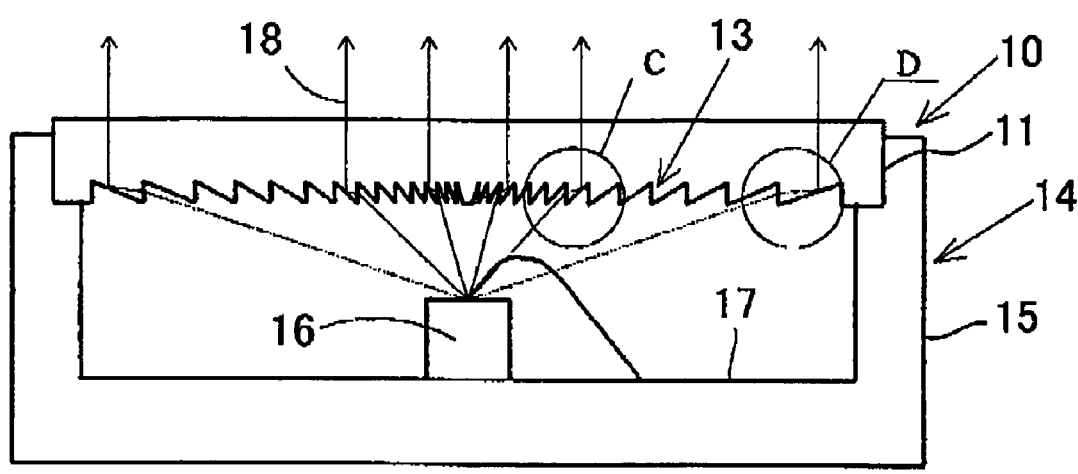
FIG. 14
PRIOR ART
FIG. 15
PRIOR ART
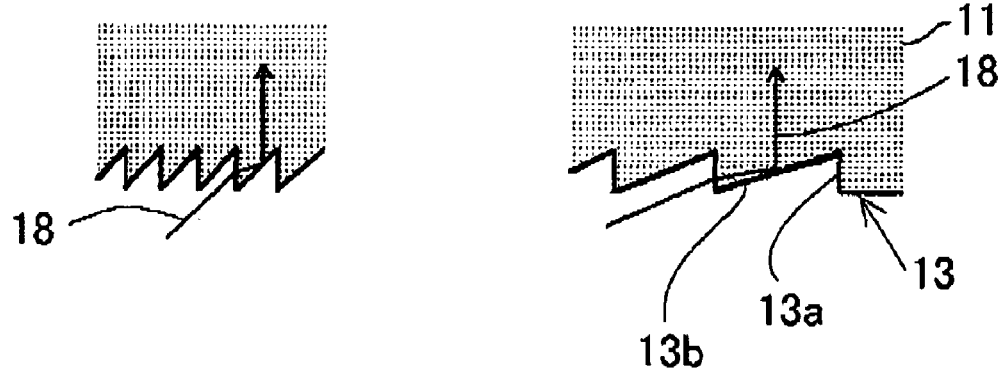

FRESNEL LENS AND AN ILLUMINATING DEVICE PROVIDED WITH THE FRESNEL LENS

BACKGROUND OF THE INVENTION

The present invention relates to a Fresnel lens and to an illuminating device comprising the Fresnel lens and an LED as a light source for using in a portable telephone, electrical appliances and others.

The illuminating device for illuminating displays of portable telephones and small electrical appliances comprises a light source such as an LED or lamp and a semispherical lens or Fresnel lens. Since the Fresnel lens has a thin thickness, the illuminating device can be made into a small size.

There is known two types of Fresnel lenses. One of the types is the refraction type, the other is the reflection type.

FIG. 8 is a plan view showing a refraction type Fresnel lens, FIG. 9 is a sectional side view of an illuminating device using the Fresnel lens, FIG. 10 is an enlarged view of an A-portion of FIG. 9, and FIG. 11 is an enlarged view of a B-portion of FIG. 9.

The Fresnel lens 1 comprises a central convex lens 2 formed at a central portion of an upper surface of a lens plate member 1a, and a plurality of annular circumferential lenses 3 coaxially disposed with the convex lens 2. Each of the circumferential lenses 3 has a sectional shape of a prism comprising an outside semispherical refraction face 3a and an inside cylindrical face 3b as shown in FIG. 10.

The sectional area of the prism reduces toward the periphery. Heights of the convex lens 2 and circumferential lenses 3 are substantially equal with each other and inclination angle of the refraction face 3a increases toward the periphery so that the distance between adjacent prisms reduces toward the periphery.

An illuminating device 4 shown in FIG. 9 comprises a box 5 supporting the Fresnel lens 1 and an LED 6 mounted on a bottom 7 of the box 5.

Light rays 8 emitted from the LED 6 are slightly refracted when entering the lens plate member 1a and further refracted when exiting from the lenses. Angles of refraction faces 3a are set so that the light rays 8 exit the Fresnel lens in parallel as shown in FIG. 9.

The reflection type Fresnel lens is disclosed in Japanese Patent Application Laid Open 2001-337206.

FIG. 12 is a plan view showing a reflection type Fresnel lens, FIG. 13 is a sectional side view of an illuminating device using the Fresnel lens, FIG. 14 is an enlarged view of a C-portion of FIG. 13, and FIG. 15 is an enlarged view of a D-portion of FIG. 13.

The Fresnel lens 10 comprises a plurality of annular lenses 13 coaxially formed on an underside of a lens plate member 11. Each of the annular lenses 13 has a sectional shape of a prism comprising an outside cylindrical incident face 13a and an inside inclined reflection face 13b as shown in FIG. 15.

The sectional area of the prism increases toward the periphery. Inclination angle of the reflection face 13b reduces toward the periphery so that the distance between adjacent prisms increases toward the periphery.

An illuminating device 14 shown in FIG. 13 comprises a box 15 supporting the Fresnel lens 10 and an LED 16 mounted on a bottom 17 of the box 15.

Light rays 18 emitted from the LED 16 are refracted when entering the cylindrical incident face 13a and upwardly reflected on the reflection face 13b. Angles of reflection faces 13b are set so that the light rays 18 exit the Fresnel lens in parallel as shown in FIG. 13.

Although the Fresnel lens can be made into a small size as described above, there are problems that the process for manufacturing Fresnel lens of small size is difficult. The inclination angle of the prism becomes large in the peripheral area in the refraction type lens as shown in FIG. 10, and in the central area in the reflection type lens as shown in FIG. 14, thereby increasing density of the prisms in both areas. The Fresnel lens is manufactured by molding a resin in a mold. The mold is formed by a cutting tool. In order to cut a metal to form a prism having such a large inclination angle, the vertex of the cutting tool is very small, and hence the width of the cutting tool is very small. The tip of such a cutting tool is liable to be broken. Consequently, it is difficult to manufacture the mold for Fresnel lens. Namely, there is a manufacturing limitation in vertex of the prism.

SUMMARY OF THE INVENTION

An object of the present invention is to provide a Fresnel lens which can be easily manufactured.

Another object of the present invention is to provide an illuminating device which may condense a light ray having a wide dispersion angle.

To accomplish the objectives of the present invention, there is provided a Fresnel lens comprising at least one of the following requirements:

(1) The center part of the plate-like lens is formed of refractive Fresnel lens part having a light condensing effect and the peripheral part is formed of a reflective Fresnel lens part having a light condensing effect.

(2) The refractive Fresnel lens part having a light condensing effect is formed on the upper surface of the plate-like lens and the reflective Fresnel lens part having a light condensing effect is formed on the lower surface of the plate-like lens.

(3) Including the requirement (2), furthermore, the external diameter of the refractive Fresnel lens formed on the upper surface of the plate-like lens is same or larger than the inside diameter of the reflective Fresnel lens formed on the lower surface of the plate-like lens.

(4) Including the requirement (1), furthermore, the refractive Fresnel lens part and the reflective Fresnel lens part are formed on the same surface of the plate-like lens.

(5) Including the requirement (1) or (4), furthermore, the surface of the plate-like lens having a refractive Fresnel lens part or a reflective Fresnel lens part is formed of a predetermined curved surface.

(6) Including the requirement (1) or (5), furthermore, the central axis of the refractive Fresnel lens part is not congruent with the central axis of the reflective Fresnel lens part.

To accomplish the objectives of the present invention, an illuminating device used for the present invention comprises the following requirement.

(7) Including the requirement (1) or (6), furthermore, at least one of the refractive type Fresnel lens or the reflective type Fresnel lens has a shape of an ellipse.

(8) Including the requirement (1) or (7), furthermore, adjacent to, at least one of the central axis of the refractive Fresnel lens and the reflective Fresnel lens, at least one LED chip is disposed.

These and other objects and features of the present invention will become more apparent from the following detailed description with reference to the accompanying drawings.

BRIEF DESCRIPTION OF DRAWINGS

FIG. 13 is a sectional side view of a conventional illuminating device using the Fresnel lens;

FIG. 14 is an enlarged view of a C-portion of FIG. 13; and

FIG. 15 is an enlarged view of a D-portion of FIG. 13.

DETAILED DESCRIPTION OF THE PREFERRED EMBODIMENT

Figure 1:
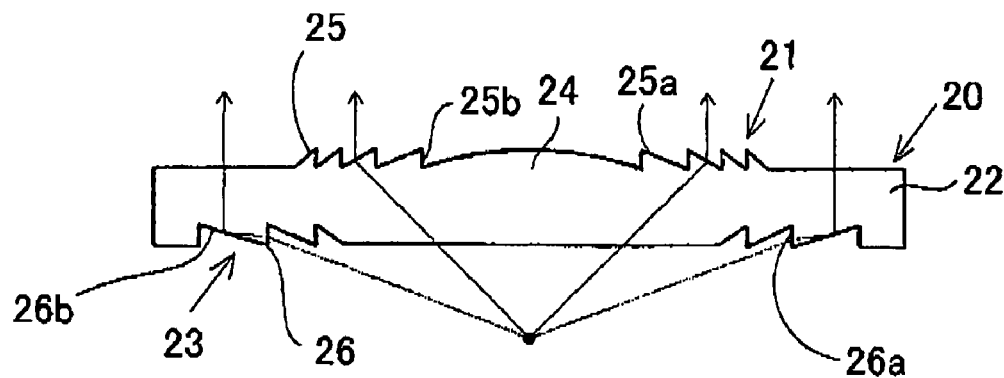
FIG. 1 is a sectional side view showing a Fresnel lens according to a first embodiment of the present invention.
Figure 2:
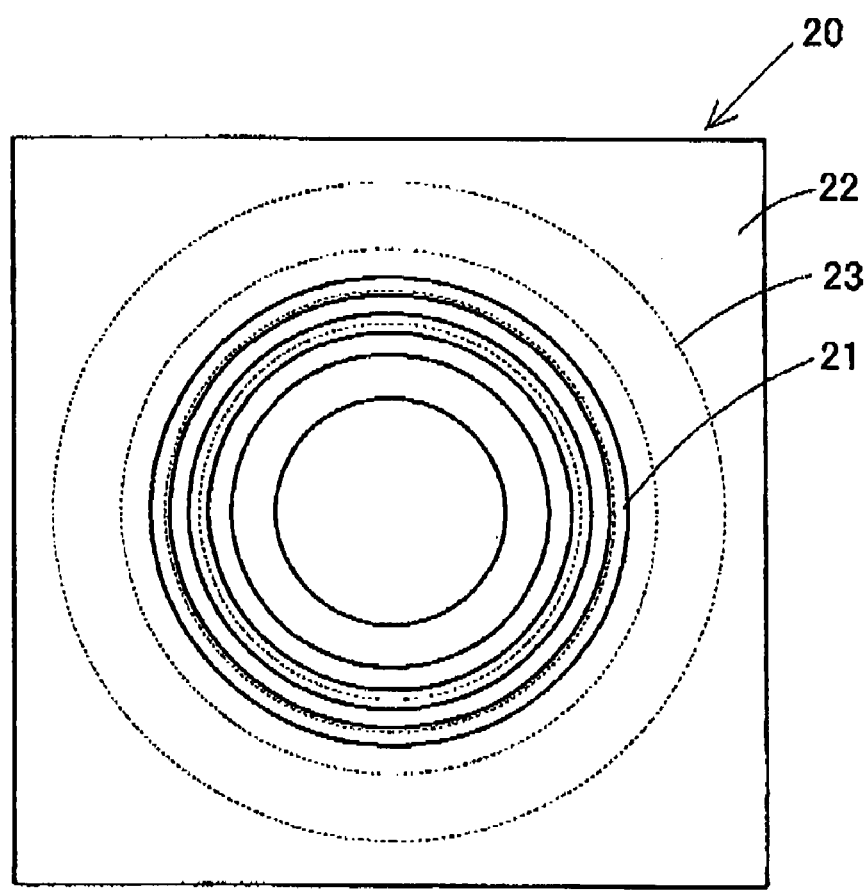
FIG. 2 is a plan view of the Fresnel lens.
Figure 3:
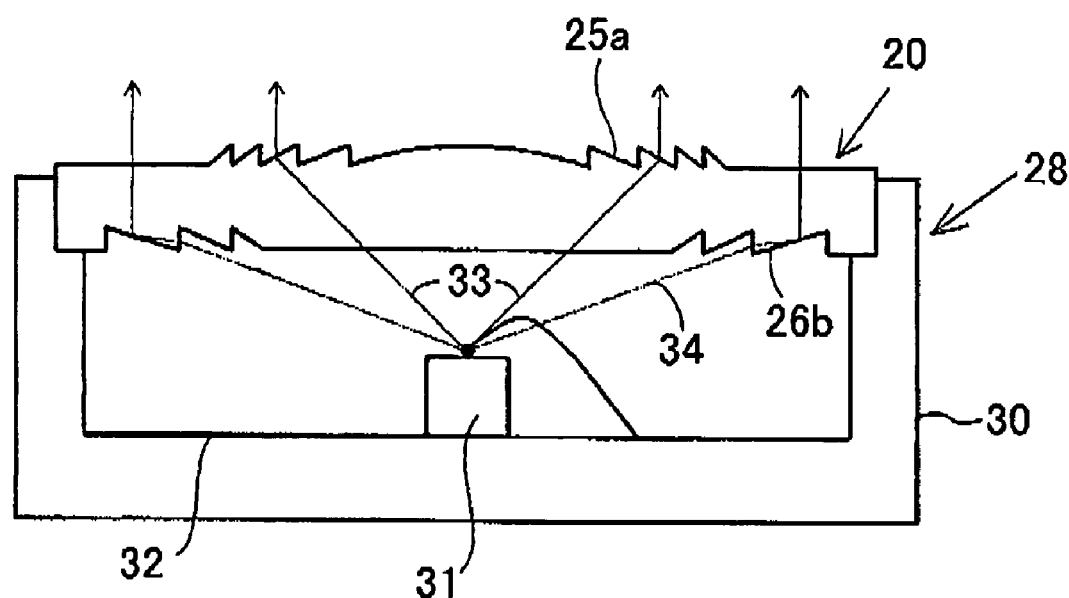
FIG. 3 is a sectional side view of an illuminating device using the Fresnel lens.

FIG. 1 is a sectional side view showing a Fresnel lens according to a first embodiment of the present invention, FIG. 2 is a plan view of the Fresnel lens, FIG. 3 is a sectional side view of an illuminating device using the Fresnel lens. The Fresnel lens is formed by molding a resin which is highly transparent and available for a precise molding such as acryl, polycarbonate and others.

The Fresnel lens 20 comprises a refractive Fresnel lens part 21 formed on an upper surface of a plate-like lens 22 at a central portion thereof, and a reflective Fresnel lens part 23 formed on the underside of the plate-like lens 22 at a peripheral portion thereof. The plate-like lens 22 made of the transparent resin has a flat plate shape. The refractive Fresnel lens part 21 comprises a central convex lens 24 formed at a central portion of the upper surface of the plate-like lens 22, and a series of annular refractive lens part 25 coaxially disposed with the convex lens 24. The refractive lens part 25 has a sectional shape of prisms. The refractive lens part 25 is composed of lenses, each having comparatively small vertex except lenses over the manufacturing limitation. The manufacturing limitation regarding a vertex of an angle is about 52°.

The reflective Fresnel lens part 23 is coaxial with the refractive Fresnel lens part 21, and comprises a series of annular reflective lens part 26. Reflective lens part 26 has a sectional shape of prisms. Referring to FIG. 3, because of these designs of the present invention, light rays 33, which are emitted in all directions from the LED 31 and enter either the refractive Fresnel lens part 25 or the reflective Fresnel lens part 26, can have a light condensing effect as a result. Also, because of the manufacturing limitation occurring parts are removed to form the plate-like Fresnel lens for the present invention, the angle of each prism of the refractive Fresnel lens part and the reflective Fresnel lens part is kept comparatively obtuse.

The illuminating device 28 shown in FIG. 3 comprises a box 30 supporting the Fresnel lens 20 and an LED 31 mounted on a bottom 32 of the box 30.

Light rays 33 emitted from the LED 31 in a central area are refracted when exiting from the refraction face 25a, and light rays 34 in a peripheral area are reflected on the reflection face 26b as shown in FIG. 3.

In the Fresnel lens, since the refraction type Fresnel lens is provided on the upper surface of the lens plate member at a central portion thereof, and the reflection type Fresnel lens is provided on the underside of the lens plate member at a peripheral portion thereof, a whole surface of the lens plate member is effectively used, and hence all light rays emitted from the light source in every direction enter either of both type Fresnel lens. Consequently, it is possible to provide a very effective Fresnel lens having a thin thickness, a large aperture diameter and high NA (numerical aperture).

Furthermore, in the Fresnel lens of the first embodiment, the external diameter of the refractive Fresnel lens part is same or larger than the inside diameter of the reflective Fresnel lens part as shown in FIGS. 1 and 3, so that there is formed an overlapped portion as shown in FIG. 2. Therefore, light rays 33 which are not caught by the reflective Fresnel lens part 23 are caught by the refractive Fresnel lens part 21 to be condensed, thereby increasing the utilization efficiency to a maximum.

Figure 4:
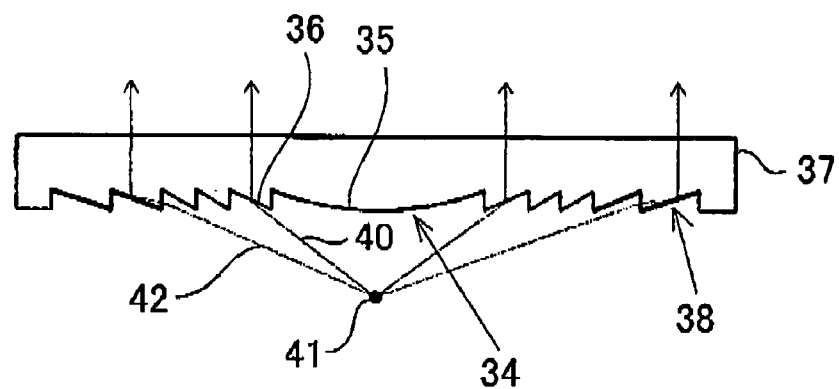
FIG. 4 is a sectional side view of a Fresnel lens according to a second embodiment of the present invention.

FIG. 4 is a sectional side view of a Fresnel lens according to a second embodiment of the present invention. The Fresnel lens comprises a refractive Fresnel lens part 34 comprising a central convex lens 35 and an annular refractive Fresnel lens part 36 provided on an underside of a lens plate member 37, and a reflective Fresnel lens part 38 provided around the refractive Fresnel lens part 34.

In the lens, light rays 40 emitted from a light source 41 are refracted in the refractive lens part 36, and peripheral light rays 42 are reflected by the reflective Fresnel lens part 38.

Figure 5:
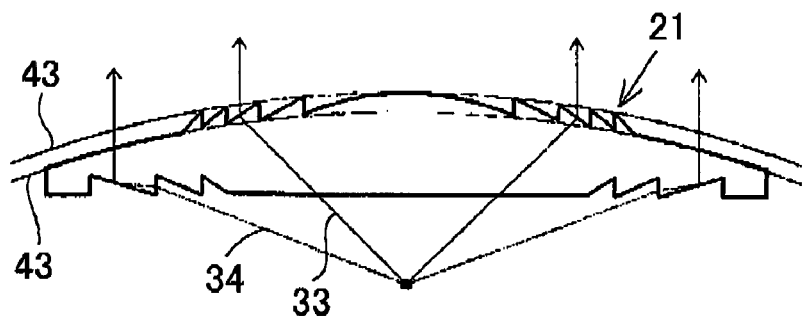
FIG. 5 is a sectional side view showing a third embodiment of the present invention.

FIG. 5 is a sectional side view showing a third embodiment of the present invention. The parts as those of FIG. 1 are identified with the same reference numerals as those of FIG. 1.

In the Fresnel lens, a plane 43 enveloping tips or bottoms of prisms of the refractive Fresnel lens part 21 is formed into a curved plane such as a spherical plane. By such a curved plane, an incident condition of light rays 34 at a peripheral portion of the lens 21 is improved.

The curved plane may be formed on the reflective lens part 23, or formed on both the lenses.

Figure 6:
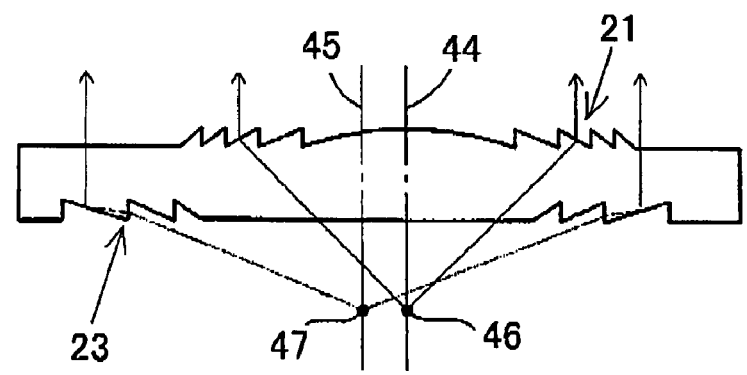
FIG. 6 is a sectional side view showing a fourth embodiment of the present invention.

FIG. 6 is a sectional side view showing a fourth embodiment of the present invention.

In the Fresnel lens, the refractive Fresnel lens part 21 and the reflective Fresnel lens part 23 are positioned, such that an optical axis 44 of the refractive Fresnel lens part 21 and an optical axis 45 of the reflective Fresnel lens part 23 are eccentrically disposed.

In order to properly enter light rays in both Fresnel lens parts, two LEDs 46 and 47 are provided at effective positions. Both the Fresnel lens parts focus at different points. Therefore, it is possible to provide an illuminating device having a specific function. Further, it is possible to provide an illumination device in which eccentrically disposed two Fresnel lens parts are provided on the same surface of a plate-like lens.

Figure 7:
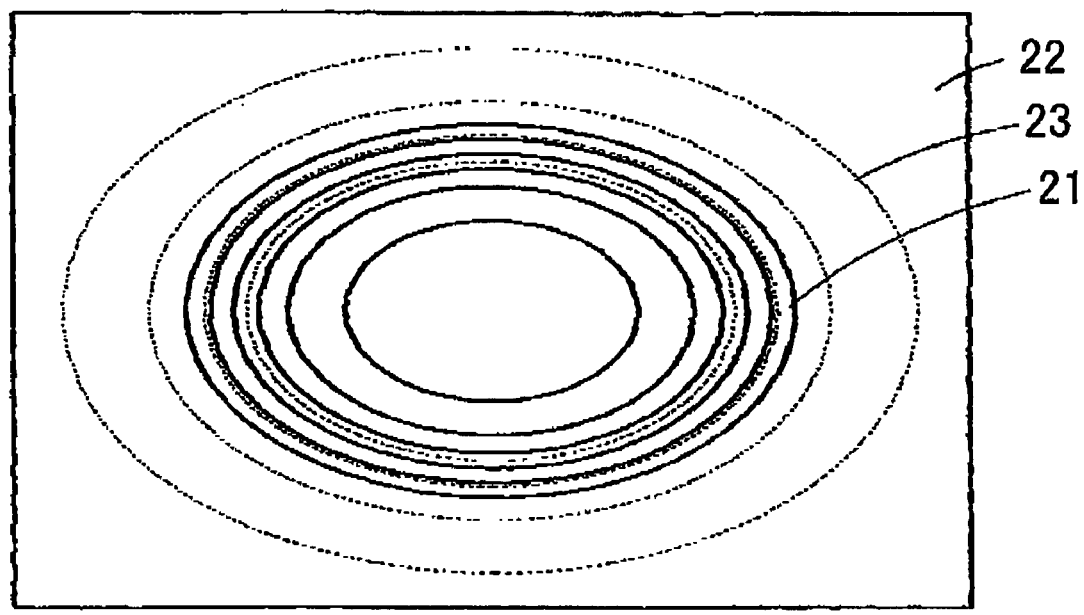
FIG. 7 is a plan view showing a fifth embodiment of the present invention.
Figure 8:
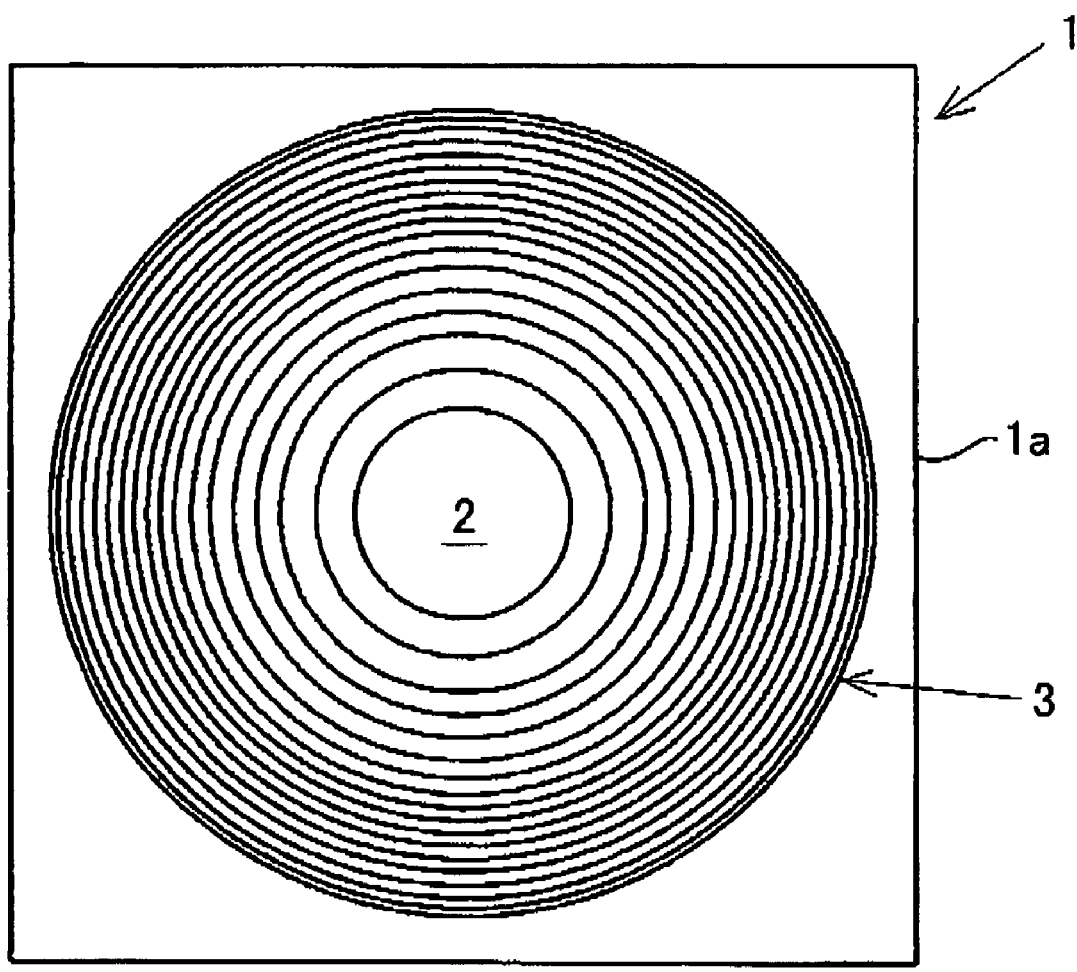
FIG. 8 is a plan view showing a conventional refraction type Fresnel lens.
Figure 9:
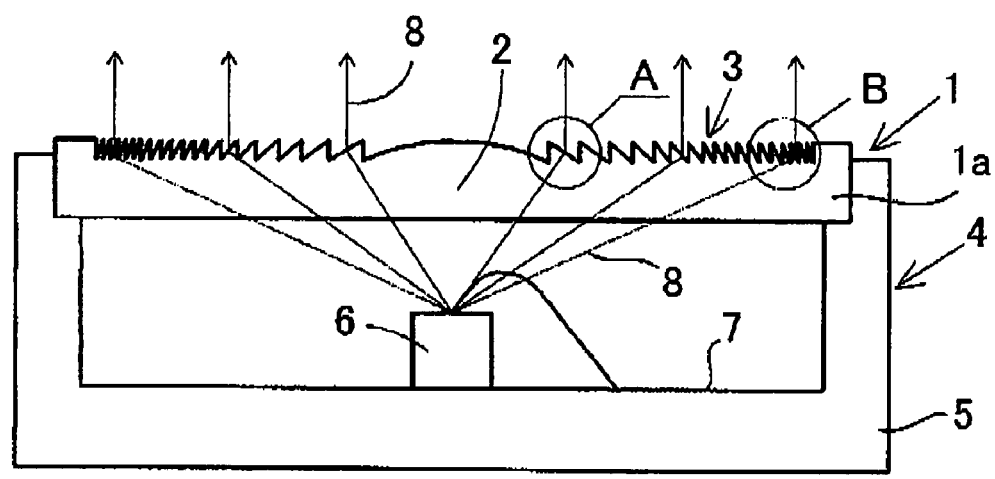
FIG. 9 is a sectional side view of a conventional illuminating device using the Fresnel lens.
Figure 10:
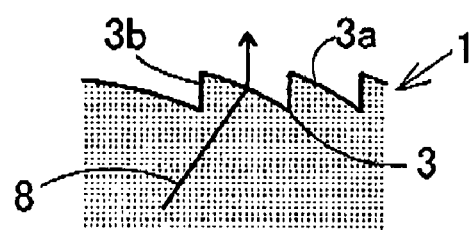
FIG. 10 is an enlarged view of an A-portion of FIG. 9.
Figure 11:
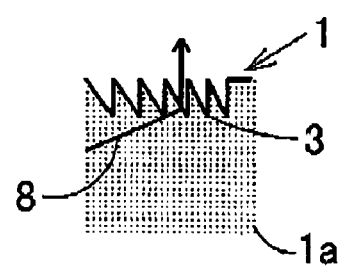
FIG. 11 is an enlarged view of a B-portion of FIG. 9.
Figure 12:
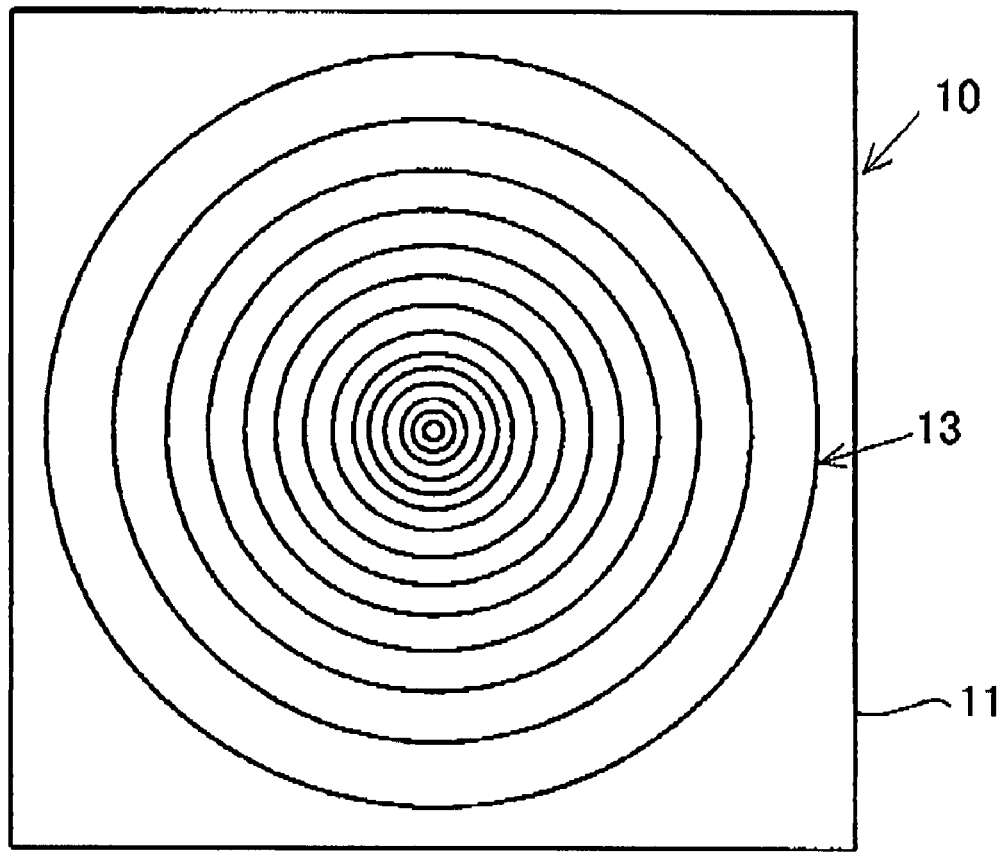
FIG. 12 is a plan view showing a conventional reflection type Fresnel lens.

The construction of the Fresnel lens is not limited to the above described constructions. For example, a Fresnel lens part having an elliptic shape shown in FIG. 7 can be used. The elliptic Fresnel lens part comprises a plurality of elliptic prisms each having a cylindrical axis parallel to an optical axis, these prisms are displaced in the axial direction to form a thin Fresnel lens.

Since the elliptic Fresnel lens part has a plurality of focuses, the lens has unique lens effects. For example, if the lens is used for condensing light rays, the light rays are condensed into a bright line. If the lens is applied to the CCD camera or COMS camera, it is possible to read a distorted image. Further, it is possible to provide a refractive Fresnel lens and a reflective Fresnel lens on a side of the lens plate member.

In accordance with the present invention, the Fresnel lens is composed by properly combining the refractive Fresnel lens part and reflective Fresnel lens part, each prism of the Fresnel lens parts having a vertex considering the manufacturing limitation. Therefore, the Fresnel lens has a thin thickness, a large aperture diameter and high NA, and can be easily manufactured. Further, the Fresnel lens of the present invention can be used in other optical objects than the illumination such as image formation and reading of images.

The illumination device using the Fresnel lens of the present invention can be manufactured into a device having a thin thickness and a small size, and having a high utilization rate. Furthermore, the illuminating device is improved in brightness. By combining various Fresnel lens parts and setting positions of LEDs, the illumination device has high characteristics in illumination effect.

While the invention has been described in conjunction with preferred specific embodiment thereof, it will be understood that this description is intended to illustrate and not limit the scope of the invention, which is defined by the following claims.

What is claimed is:

1. A Fresnel lens comprising:
   a transparent plate member;
   a refractive Fresnel lens part comprising a plurality of refractive faces formed on an upper surface of the plate member; and
   a reflective Fresnel lens part comprising a plurality of reflective faces formed on a lower surface of the plate member;
   wherein the refractive Fresnel lens part is formed on a central part of the plate member, and the reflective Fresnel lens part is formed on a peripheral part of the plate member,
   a peripheral portion of the refractive Fresnel lens part and an inner edge portion of the reflective Fresnel lens part overlapping in top plan view.

2. The Fresnel lens according to claim 1, wherein at least one surface formed of the refractive Fresnel lens part or the reflective Fresnel lens part has a predetermined curved surface.

3. The Fresnel lens according to claim 1, furthermore comprising at least one LED chip disposed on or adjacent to a common central axis of the refractive Fresnel lens part and the reflective Fresnel lens part.

4. The Fresnel lens according to claim 1, wherein each of the refractive Fresnel lenses and the reflective Fresnel lenses has a vertex of an angle larger than 52°.

5. A Fresnel lens comprising:
   a transparent plate member; and
   a refractive Fresnel lens part formed on an upper surface of the plate member and a reflective Fresnel lens part formed on a lower surface of the plate member;
   wherein a central axis of the refractive Fresnel lens part is not congruent with a central axis of the reflective Fresnel lens part.

6. The Fresnel lens according to claim 5, wherein at least one surface formed of the refractive Fresnel lens part or the reflective Fresnel lens part has a shape of an ellipse.

7. The Fresnel lens according to claim 5, further comprising at least one LED chip disposed adjacent to at least one central axis of the refractive Fresnel lens part or the reflective Fresnel lens part.

8. The Fresnel lens according to claim 5, wherein at least one surface formed of the refractive Fresnel lens part or the reflective Fresnel lens part has a predetermined curved surface.

9. The Fresnel lens according to claim 5, further comprising two LED chips, one of said LED chips being disposed on the central axis of the refractive Fresnel lens part and one of said LED chips being disposed on the central axis of the reflective Fresnel lens part.

10. A Fresnel lens comprising:
    a transparent plate member; and
    a refractive Fresnel lens part formed on a surface of the plate member, and a reflective Fresnel lens part formed on the same surface of the plate member;
    wherein a central axis of the refractive Fresnel lens part is not congruent with a central axis of the reflective Fresnel lens part.

11. The Fresnel lens according to claim 10, furthermore comprising at least one LED chip disposed adjacent to at least one of the central axis of the refractive Fresnel lens part or the reflective Fresnel lens part.

12. The Fresnel lens according to claim 10, further comprising two LED chips, one of said LED chips being disposed on the central axis of the refractive Fresnel lens part and one of said LED chips being disposed on the central axis of the reflective Fresnel lens part.

* * * * *